(12) United States Patent
Mojarradi et al.

(10) Patent No.: US 7,514,998 B2
(45) Date of Patent: Apr. 7, 2009

(54) WIDE-TEMPERATURE INTEGRATED OPERATIONAL AMPLIFIER

(75) Inventors: Mohammad Mojarradi, La Canada, CA (US); Greg Levanas, Costa Mesa, CA (US); Yuan Chen, Pasadena, CA (US); Raymond S. Cozy, Altadena, CA (US); Robert Greenwell, Knoxville, TN (US); Stephen Terry, Knoxville, TN (US); Benjamin J. Blalock, Knoxville, TN (US)

(73) Assignee: California Institute of Technology, Pasadena, CA (US)

( * ) Notice: Subject to any disclaimer, the term of this patent is extended or adjusted under 35 U.S.C. 154(b) by 65 days.

(21) Appl. No.: 11/636,365

(22) Filed: Dec. 7, 2006

(65) Prior Publication Data

US 2007/0229158 A1     Oct. 4, 2007

Related U.S. Application Data

(60) Provisional application No. 60/748,360, filed on Dec. 7, 2005.

(51) Int. Cl.
*H03F 3/45*    (2006.01)
*H01L 35/00*   (2006.01)
*G05F 3/02*    (2006.01)

(52) U.S. Cl. .................... 330/256; 327/513; 327/539
(58) Field of Classification Search .................. None
See application file for complete search history.

(56) References Cited

U.S. PATENT DOCUMENTS

| | | | | |
|---|---|---|---|---|
| 4,042,886 A * | 8/1977 | Hanna | ........................ | 330/256 |
| 6,310,512 B1 * | 10/2001 | Briskin et al. | ................ | 327/552 |
| 6,384,585 B2 * | 5/2002 | Cusinato et al. | .............. | 323/312 |
| 6,614,209 B1 * | 9/2003 | Gregoire, Jr. | ................ | 323/316 |
| 6,982,598 B2 * | 1/2006 | Oppelt | ........................ | 330/256 |
| 7,372,244 B2 * | 5/2008 | Marinca | ...................... | 323/316 |
| 7,446,598 B2 * | 11/2008 | Pertijs et al. | ................. | 327/539 |
| 7,446,599 B1 * | 11/2008 | Wang | .......................... | 327/539 |
| 2008/0122526 A1 * | 5/2008 | Chung | ......................... | 327/537 |

OTHER PUBLICATIONS

M. Al-Sheikhly and A. Christou, "Tutorial: How Radiation Affects Polymetric Materials," IEEE Trans. Reliability, vol. 43, No. 4, p. 551, 1994.

* cited by examiner

*Primary Examiner*—Robert Pascal
*Assistant Examiner*—Krista M Flanagan
(74) *Attorney, Agent, or Firm*—Tope-McKay & Associates

(57) ABSTRACT

The present invention relates to a reference current circuit. The reference circuit comprises a low-level current bias circuit, a voltage proportional-to-absolute temperature generator for creating a proportional-to-absolute temperature voltage (VPTAT), and a MOSFET-based constant-IC regulator circuit. The MOSFET-based constant-IC regulator circuit includes a constant-IC input and constant-IC output. The constant-IC input is electrically connected with the VPTAT generator such that the voltage proportional-to-absolute temperature is the input into the constant-IC regulator circuit. Thus the constant-IC output maintains the constant-IC ratio across any temperature range.

18 Claims, 8 Drawing Sheets

|  | Constant $I$ | Constant $g_m$ | Constant $IC$ |
|---|---|---|---|
| SR Variation ($SR_{120}/SR_{-180}$) | 1 | W.I.: 4.2<br>S.I.: 8.7 | 2.04 |
| BW Variation ($BW_{120}/BW_{-180}$) | W.I.: 0.24<br>S.I.: 0.34 | 1 | 0.49 |

FIG. 2

WIDE-TEMPERATURE INTEGRATED OPERATIONAL AMPLIFIER

PRIORITY CLAIM

The present application is a non-provisional patent application, claiming the benefit of priority of U.S. Provisional Application No. 60/748,360, filed on Dec. 7, 2005 entitled "A Wide Temperature Integrated Operational Amplifier."

STATEMENT OF GOVERNMENT INTEREST

The invention described herein was made in the performance of work under a NASA contract and is subject to the provisions of Public Law 96-517 (35 USC 202) in which the Contractor has elected to retain title.

BACKGROUND (1) Field of the Invention

The present invention relates to integrated operational amplifiers and, more particularly, to analog, wide temperature range, quad operational-amplifiers.

(2) Background of the Invention

Electronic devices permeate the modern world. They are used in everything from appliances to computers to state-of-the-art scientific apparatuses. Given the broad range of applications and, accordingly, the broad range of environments in which modern electronics are required to reliably operate, means for hardening electronic devices against extreme environmental variables.

Perhaps the harshest environment in which modern electronics are required to operate is outer space. In a typical space application, when a circuit is exposed to direct sunlight, its temperature can rise to over 120° C., higher than the boiling temperature of water on Earth. In the absence of sunlight, the vacuum of space can rapidly cool the same circuit to 180° C. below zero, a temperature nearly cold enough to make liquid Nitrogen on Earth.

Modern integrated circuit elements require current references to accomplish proper circuit element biasing. If the same circuits are to operate in extreme temperatures, these circuits require current references that stay nearly constant over the required operating range, otherwise circuit performance will change when integrated transistors become improperly biased.

In the best-case scenario, improper biasing causes changes in the transistors' inversion levels, electron and hole mobilities, and thermal voltage levels. These changes drastically alter the performance characteristics of transistors and typically render a circuit useless unless care has been taken to compensate for such changes. In the worst-case scenario, changes in the current reference lead to overvoltage or voltage surges in the circuit, causing irreversible failure of the device; the mechanisms for such non-reversible failure are typically hot carrier injection and breakdown of oxide layers due to high gate-to-source voltages.

In the past, attempts to make current references that are resistant to such temperature effects have primarily used one of two transistor integration techniques: the first is the constant transconductance method and the second is the constant current method.

The constant transconductance method minimizes variations in small-signal performance parameters, such as bandwidth, when temperatures change. However, the reduction of temperature sensitivity to small-signal parameters leads to increased temperature sensitivity in large-signal parameters, such as slew rate.

As an alternative to the constant transconductance method, the constant current method has been used. The constant current method minimizes variations in large-signal parameters at the expense of small-signal parameters.

In general, it is desirable to simultaneously minimize variations in both small-signal parameters and large-signal parameters with respect to temperature, and neither of the above-described methods can achieve simultaneous minimization of both small-signal and large-signal parameter variations with temperature.

Another extreme environmental variable to which circuits can be exposed is radiation. Radiation degrades transistor performance by knocking atoms out of lattice sites, which cause defects, and scattering electrons and holes out of regions to which they would otherwise be bound. Both processes drastically change the functionality and characteristics of transistors.

Transistors can be exposed to radiation in many different environments, non-limiting examples of which include instrumentation for nuclear reactors, modern laboratory environments in which radioisotopes or cosmic background radiation are studied, and outer space.

Typical metal-on-silicon (MOS) components do not withstand radiation, making the devices unreliable in applications in which they are exposed to radiation. However, several modern technologies, for example silicon-on-insulator (SOI) MOS components, are more resistant to radiation damage than typical bulk MOS devices. SOI MOS devices, as an example, are surrounded by insulator layers, non-limiting examples of which are silicon nitride and silicon oxynitride, that shield the silicon and metals from radiation.

Finally, as discussed above, overvoltage can typically cause non-reversible damage to integrated circuit components. Exacerbating such problems is the recent move of the state-of-the-art from 5 Volt transistors to 3.3 Volt transistors. If new circuits using the 3.3 Volt technology are to be integrated with old circuits and power supplies using the 5 Volt technology, steps must be taken to ensure that overvoltage events do not destroy circuits.

SUMMARY OF THE INVENTION

The present invention relates to a reference current circuit. The reference circuit comprises a low-level current bias circuit, a voltage proportional-to-absolute temperature generator for creating a proportional-to-absolute temperature voltage (VPTAT), and a MOSFET-based constant-IC regulator circuit. The MOSFET-based constant-IC regulator circuit includes a constant-IC input and constant-IC output. The constant-IC input is electrically connected with the VPTAT generator such that the voltage proportional-to-absolute temperature is the input into the constant-IC regulator circuit. Thus the constant-IC output maintains the constant-IC ratio across any temperature range.

In yet another aspect, the reference current circuit further comprises a bias current distribution circuit. The bias current distribution circuit itself comprises a bias current circuit, a bias current output electrically connected to the bias current circuit, a current reference input electrically connected to the bias current circuit, and a power input electrically connected to the bias current circuit. The current reference input is electrically connected with the current reference circuit via the constant-IC output, with the bias current distribution circuit generating an output bias current in response to the constant-IC output. Thus the output bias current is used to bias a load circuit such that the performance characteristics over a wide temperature range are minimized.

In yet another aspect, the reference current further comprises a startup circuit electrically connected to the reference circuit. If the startup reference current is larger than the output current of the constant-IC regulator, current is injected into the bias circuitry of the VPTAT generator and the constant-IC regulator to facilitate startup of the current reference.

In yet another aspect, the reference current circuit further comprises a common-mode feedback (CMFB) circuit electrically connected with the input of the reference circuit. In this way, the CMFB circuit prevents VPTAT from floating.

The present invention also relates to a self-biased operational amplifier. The self-biased operational amplifier comprises a current reference circuit. This current reference circuit itself includes the following circuit elements: a low-level current bias circuit; a voltage proportional-to-absolute temperature generator for creating a proportional-to-absolute temperature voltage (VPTAT); a MOSFET-based constant-IC regulator circuit including a constant-IC input and constant-IC output, the constant-IC input is electrically connected with the VPTAT generator such that the voltage proportional to absolute temperature is the input into the constant-IC regulator circuit; a bias current distribution circuit that comprises a bias current circuit, a bias current output electrically connected to the bias current circuit, and a current reference input electrically connected to the bias current circuit; and a power input electrically connected to the bias current circuit, the current reference input is electrically connected with the current reference circuit via the constant-IC output, with the bias current distribution circuit generating an output bias current in response to the constant-IC output; a current reference input electrically connected with the current reference circuit via the constant-IC output, the bias current distribution circuit acting to generate an output bias current in response to the constant-IC output; an input stage electrically connected with a reference voltage VREF to set the common-mode level, the input stage further including an input circuit, a non-inverting input, an inverting input, an output, and a current bias input, the current bias input electrically connected with the bias current output; an output stage including an output circuit, a non-inverting input electrically connected with the output circuit, an inverting input electrically connected with the output circuit, an output electrically connected with the output circuit, and a current bias input electrically connected with the output circuit, the current bias input further electrically connected with the bias current output. Thus the output bias current biases the pre-amp and output driver of the load circuit to stabilize the small signal and large signal characteristics.

In yet another aspect, the self-biased operational amplifier further comprises the following elements: a first universal power pad VDD and a second universal power pad VSS; a tail current steering device electrically connected with VDD and VSS; a complementary input pair electrically connected in parallel with the tail current steering device via VDD and VSS; a regulated folded cascode electrically connected in parallel with the tail current steering device via VDD and VSS; and a common-mode feedback circuit electrically connected in parallel with the tail current steering device via VDD and VSS. Thus the fully differential input stage allows for a controlled output level for small-signal inputs and a clamp-able output signal when slewing or performing other large-signal functions.

In yet another aspect, the self-biased operational amplifier has a reference circuit that further includes a power control electrically connected with the current distribution circuit for operating the load circuit in either a full power mode or half power mode. Switching to half power mode is accomplished by halving the bias current fed into a load circuit component from the current reference.

In yet another aspect, the self-biased operational amplifier further comprises a power control electrically connected with the bias distribution cell. The power control's purpose is to convert a 0-V or NC (no connection) state or 5-V logic level to a signal to drive the bias current distribution cell.

In yet another aspect, the self-biased operational amplifier's power control operates the load circuit in either a full-power mode or half-power mode. Thus switching to half-power mode is accomplished by halving the bias current fed into a load circuit component from the current reference.

In yet another aspect, the self-biased operational amplifier's output of the input stage further comprises a regulated folded cascode circuit. The regulated folded-cascode structure provides high output resistance and therefore high gain for the first stage.

In yet another aspect, the self-biased operational amplifier further comprises a frequency compensation network electrically connected between the output of the output stage and the input of the output stage. The frequency compensation network comprises a Miller capacitor electrically connected with the frequency compensation network, a matching capacitor, and an array of MOSFETs electrically connected to each other. whereby the compensation network utilizes Miller compensation with right-half plane zero compensation.

The present invention also relates to another self-biased operational amplifier. This self-biased operational amplifier comprises a current reference circuit including: a low level current bias circuit; a voltage proportional-to-absolute temperature generator for creating a proportional-to-absolute temperature voltage (VPTAT); and a MOSFET-based constant-IC regulator circuit including a constant-IC input and constant-IC output. The constant-IC input is electrically connected with the VPTAT generator such that the voltage proportional to absolute temperature is the input into the constant-IC regulator circuit. The self-biased operational amplifier also comprises a bias current distribution circuit including: a bias current output, a current reference input, and a power input. The current reference input is electrically connected with the current reference circuit via the constant-IC output. The bias current distribution circuit acts to generate an output bias current in response to the constant-IC output. The self-biased operational amplifier also comprises an input stage electrically connected with a reference voltage VREF to set the common-mode output level. The input stage itself includes the following: a non-inverting input, a inverting input, a output, and a current bias input. The current bias input is electrically connected with the bias current output. The self-biased operational amplifier also comprises an output stage including a non-inverting input, an inverting input, an output, and a current bias input. The current bias input is electrically connected with the bias current output. The self-biased operational amplifier also includes a regulated-ohmic cascode structure to bias the gates of the cascode transistors in the output branch if the amplifier is operated by a power supply voltage which exceeds that of the technology by as much as 50% of the maximum voltage rating. Thus the output bias current is used to bias the pre-amp and output driver of the load circuit to stabilize small signal and large signal characteristics when the power supply voltage is as much as 50% higher than that normally allowed by the technology.

In yet another aspect, the self-biased operational amplifier has a frequency compensation network which is electrically connected between the output of the output stage and the inputs of the output stage. The frequency compensation network itself comprises: a Miller capacitor electrically connected with the frequency compensation network; a matching capacitor; and an array of MOSFETs electrically connected to each other. Thus the compensation network utilizes Miller compensation with right-half-plane zero-compensation.

In yet another aspect, the self-biased operational amplifier's fully-differential input stage further comprises: a first universal power pad VDD and a second universal power pad VSS; a tail current steering device electrically connected with VDD and VSS; a tail current steering device electrically connected with VDD and VSS; a complementary input pair electrically connected in parallel with the tail current steering device via VDD and VSS; a regulated folded cascode electrically connected in parallel with the tail current steering device via VDD and VSS; and a common-mode feedback circuit electrically connected in parallel with the tail current steering device via VDD and VSS. Thus the fully differential input stage allows for a relatively controlled output level for small-signal inputs, and a clamp-able output signal when slewing or performing other large-signal functions.

In yet another aspect, the self-biased operational amplifier has a reference circuit that further includes a power control for operating the load circuit in either a full power mode or half power mode. Thus switching to half power mode is accomplished by halving the bias current fed into a load circuit component from the current reference.

BRIEF DESCRIPTION OF THE DRAWINGS

The objects, features and advantages of the present invention will be apparent from the following detailed descriptions of the various aspects of the invention in conjunction with reference to the following drawings, where:

FIG. 2 is a graph contrasting the magnitude of parameter variation between the constant inverse coefficient current bias versus temperature versus temperature exponent;

DETAILED DESCRIPTION

Figure 1:
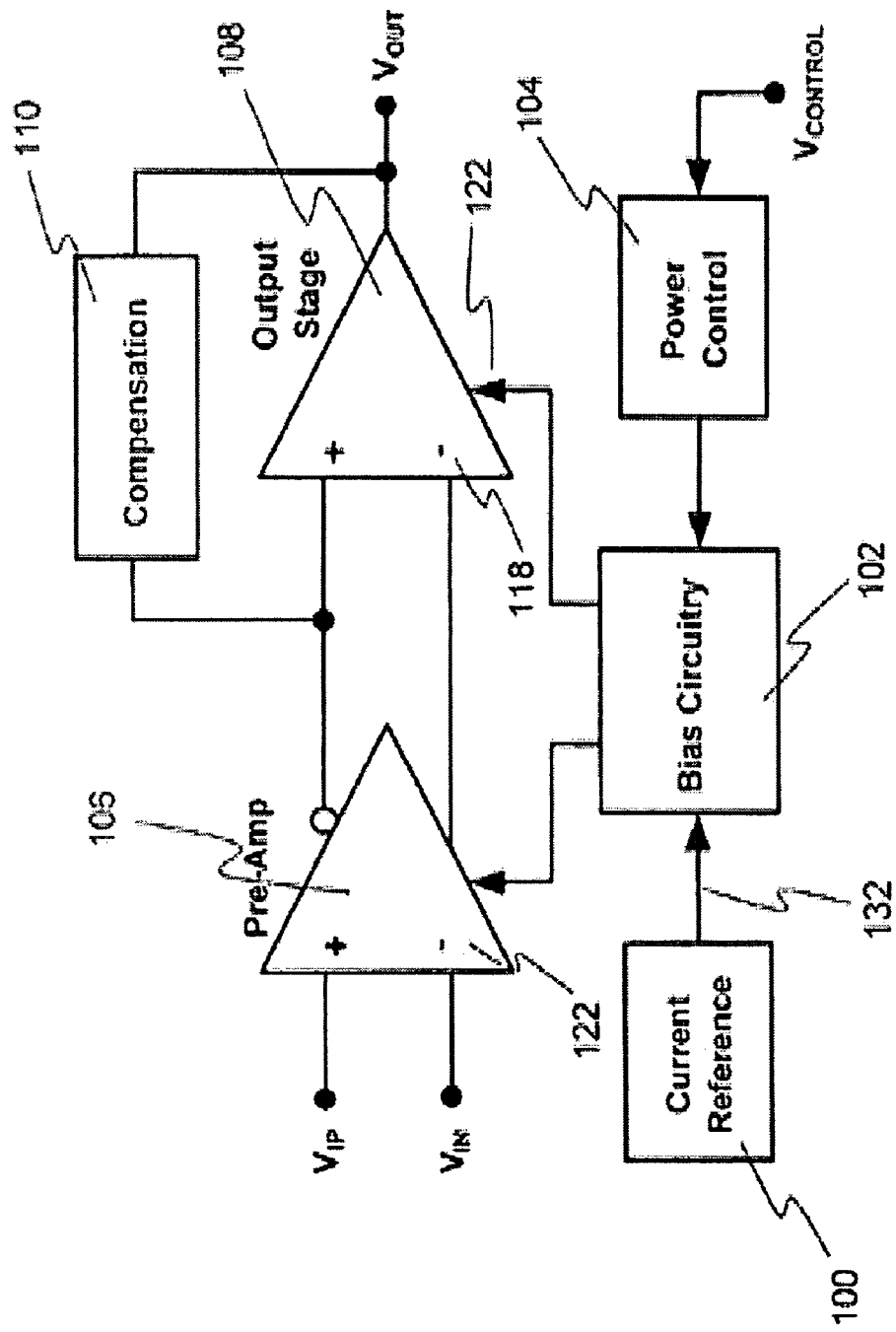
FIG. 1 is a illustration of a operational amplifier top-level diagram.

The present invention relates to a circuit and method for biasing electronic devices. The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the claims herein is not intended to invoke the provisions of 35 U.S.C. 112, Paragraph 6.

Before describing the invention in detail, first an introduction provides the reader with a general understanding of the present invention. Next, details of the present invention are provided to give an understanding of the specific aspects. Finally, a summary is provided as a synopsis of the present invention.

(1) Introduction

The present invention has three "principal" aspects. The first is a reference current circuit. The reference current circuit generates a constant inversion current or constant-IC current which is defined by the relationship of a MOSFET $g_M/I_D$ ratio. The second principal aspect is a bias current distribution circuit. The bias distribution circuit serves to receive and redistribute a constant-IC current received from the current reference circuit to a load circuit that may be biased. The third principle aspect of the invention is a user controlled power control electrically connected with the bias distribution cell in order to manipulate and enhance functionality of the bias distribution cell. This system may be incorporated into a wide variety of biased devices where small- and large-signals must be simultaneously optimized. This system also may be applied to biased devices where a designer wishes to minimize changes in performance of a biased device over a broad temperature range.

The present invention uses a current reference 100 assisted by a bias current distribution circuit 102 to bias a multitude of devices in which it is desirable to simultaneously optimize small- and large-signal characteristics by biasing an electronic device using a constant-IC current defined by the $g_M/I_D$ relationship. One such device is depicted in FIG. 1 in which a top-level diagram of an operational amplifier 10 is presented. The operational amplifier 10 is comprised of a fully-differential input stage 106, single-ended output stage 108, current reference circuit 100, bias current distribution circuit 102, a power control circuit 104, and a compensation network 110.

In the general case it is often desirable to simultaneously minimize variations in both small- and large-signal performance. To accomplish this, a constant Inversion Coefficient (IC) current reference may be incorporated into a design as the optimum current reference (bias) for achieving this tradeoff. The $g_M/I_D$, or constant-IC current, is well suited for biasing a multitude of circuits including CMOS analog circuits. In contrast to previous biasing techniques, such as the constant current and constant (transductance) $g_M$, the constant-IC current biasing technique minimizes fluctuations in addition to operating across broad temperature ranges. An example of the magnitude of change of the large- and small-signal variations for the three types of current references is shown in FIG. 2.

The present invention teaches to a constant-IC biasing circuit for biasing a variety of circuits in order to provide the best possible simultaneous small- and large-signal characteristic performance of a circuit. The present invention further acts to minimize performance variation, and although the benefits of constant-IC biasing are disclosed as they relate to a operation amplifier biased by a constant-IC current across a temperature range of operation of −180° C. to 120° C., further applications for constant-IC current biasing will be readily recognized by those having average skill in the art.

(5) Details of the Invention

Figure 3:
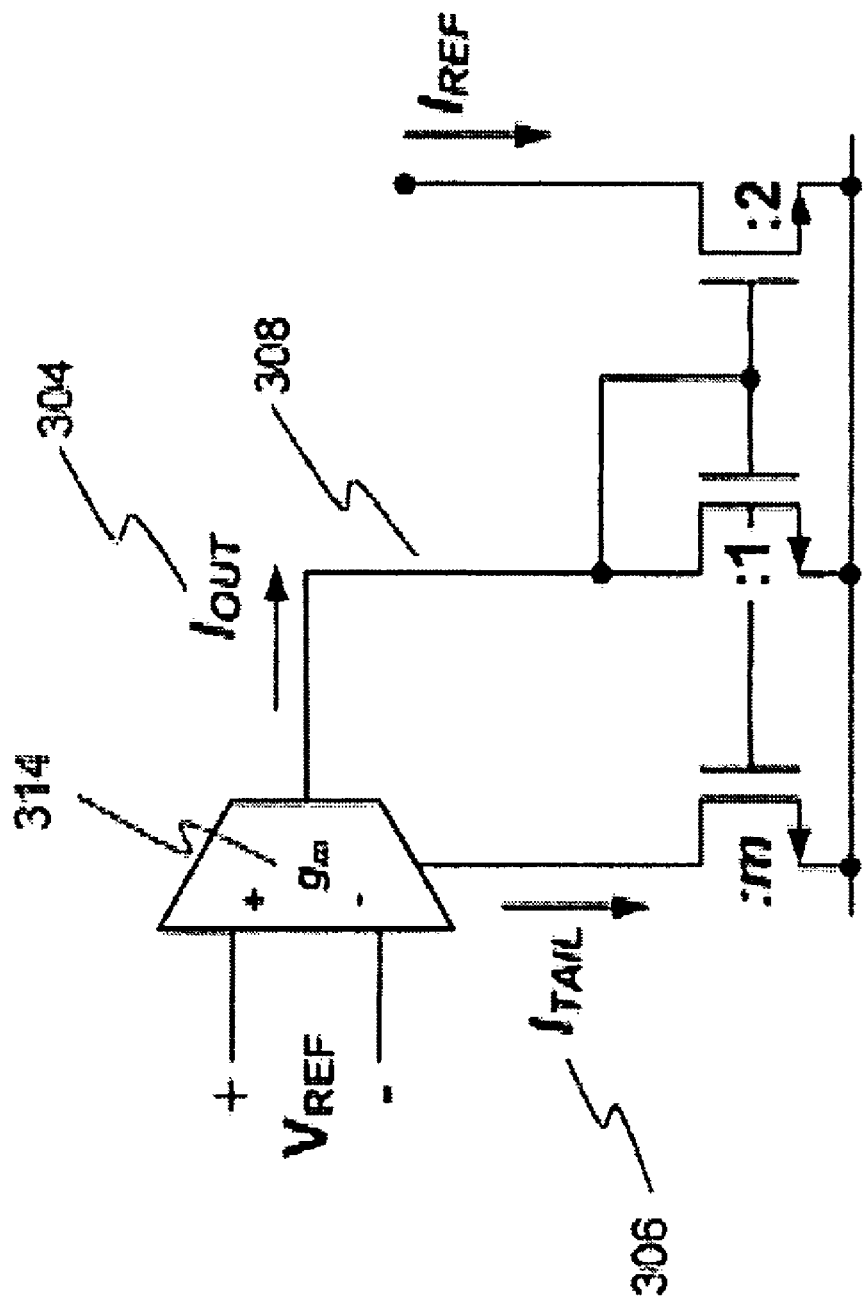
FIG. 3 is a block diagram of the constant inverse coefficient reference circuit.
Figure 4:
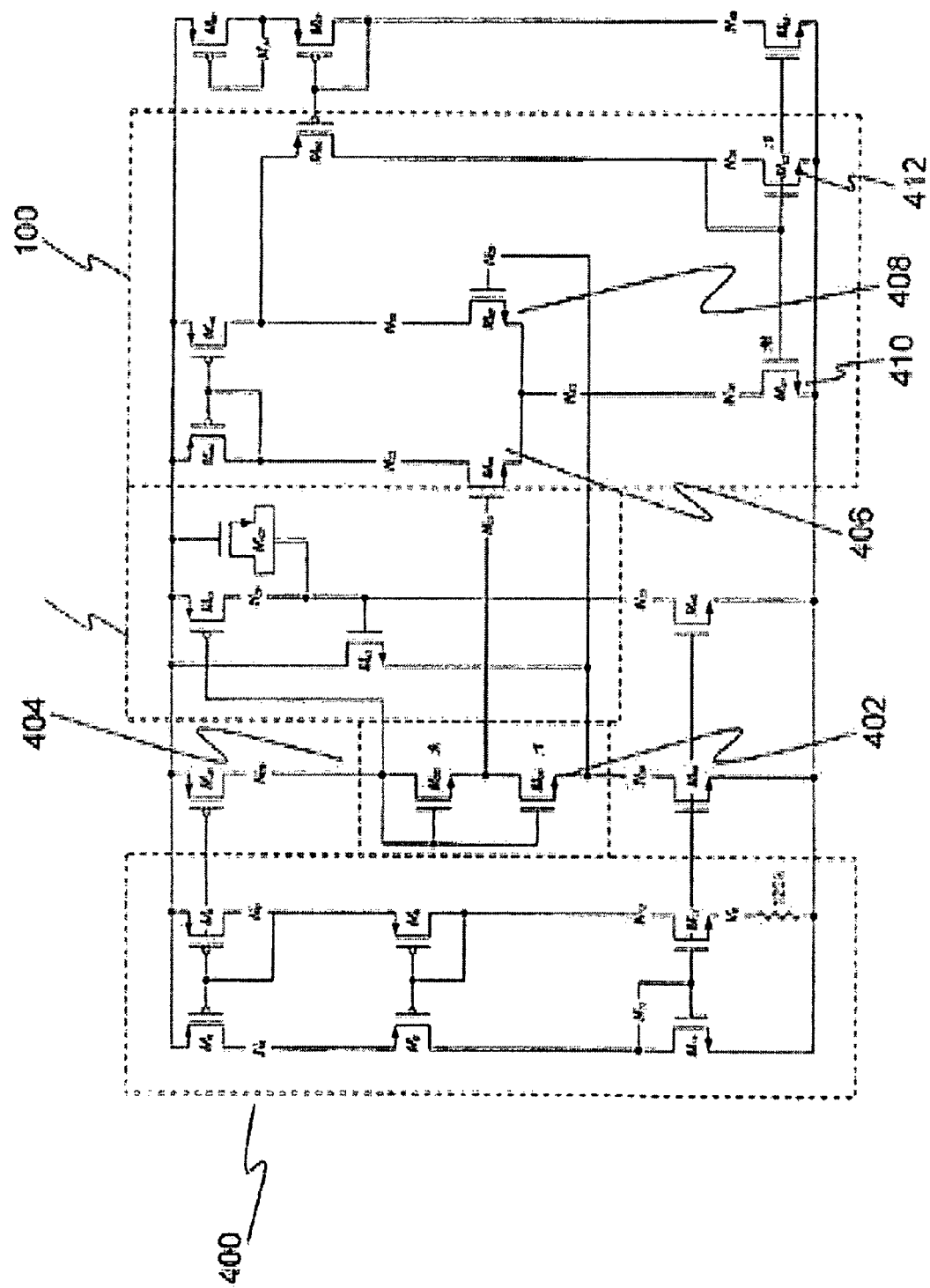
FIG. 4 is a illustration of the simplified current reference schematic.

One of the limitations of biased circuits is the inability to optimize the performance of small-scale signals such as bandwidth, and large-scale signal variations such as slew rate. Constant-IC biasing is a tradeoff between the large-signal stability provided by the constant current reference 100, and the small-signal stability provided by the constant $g_M$ reference 314. A simplified schematic for the current reference 100 is shown in FIG. 4. The basic design theory of the constant-IC current reference 100 is shown in FIG. 3. In order to calculate the constant-IC current reference, a simplified current reference circuit is shown in FIG. 4. The reference 100 operates by creating a proportional-to-absolute temperature (PTAT) voltage that is fed into a $g_M/I_D$ regulator circuit 100, the output current 132 of which maintains the MOSFET $g_M/I_D$ ratio, and therefore the inversion coefficient ($g_M/I_D$), across temperature. The first two branches of the current reference shown in FIG. 4 make up a simple low-level (low current) current generator 400 that biases M32 402 and M33 404. This small current ensures that M32 402 and M33 404 are biased in weak inversion, in order to create the PTAT voltage.

The drain current equation for a MOSFET in weak inversion is given as:

$$I_D = I_S \exp\left(\frac{V_{GS} - V_T}{nU_T}\right),$$

where $I_S$ is the saturation current, $U_T$ the thermal voltage, $V_T$ the threshold voltage, and n the subthreshold slope parameter. From this the expression for $V_{GS}$ is derived as:

$$V_{GS} = \ln\left(\frac{I_D}{I_S}\right)nU_T + V_T,$$

The PTAT voltage is measured from the source of M32 402 to the source of M33 404. Here again, thanks to PDSOI, body effect is eliminated in M32 and M33. M32 and M33 are also matched in layout. Taking the voltage from the source of M32 to source of M33 to be $V_{REF}$ (not to be confused with $V_{REF}$ of the compensation network 110 shown in FIG. 7), the PTAT voltage can be calculated as:

$$V_{REF} = V_{GS,M32} - V_{GS,M33},$$

$$V_{REF} = \ln\left(\frac{I_D}{I_{S,M32}}\right)nU_T + V_T - \left[\ln\left(\frac{I_D}{I_{S,M32}}\right)nU_T + V_T\right], \text{ and}$$

$$V_{REF} = nU_T \ln\left[\left(\frac{I_D}{I_{S,M32}}\right)\left(\frac{I_{S,M33}}{I_D}\right)\right] = nU_T \ln\left(\frac{I_{S,M33}}{I_{S,M32}}\right),$$

Selecting M33 to have an aspect ratio k times greater than M32, $$I_{S,M33} = kI_{S,M32}, \text{ and}$$

$$V_{REF} = nU_T \ln(k).$$

Since thermal voltage ($U_T$) is equal to kT/q (where k is Boltzmann's constant), the only undefined variables are temperature and the subthreshold slope parameter, n. Neglecting the small variance in n, this makes the voltage $V_{REF}$ dependent upon changes in temperature, and therefore a PTAT voltage.

$V_{REF}$ becomes the input to the $g_M/I_D$ regulator. A block diagram of which is given in FIG. 3. The current $I_{OUT}$ 304 is defined as:

$$I_{OUT} = g_m V_{REF},$$

and $I_{TAIL}$ 306 and $I_D$ 308 are defined as:

$$I_{TAIL} = mI_{OUT}, \text{ and}$$

$$I_D = \frac{I_{TAIL}}{2},$$

respectively where $I_{TAIL}$ 306 biases the transconductor block 308, implemented using an NMOS input pair (M46 406, M47 408 in FIG. 4). Solving for the constant-IC $g_M/I_D$, during balanced (quiescent) operation, $$I_{OUT} = I_D\left(\frac{2}{m}\right),$$

$$g_m V_{REF} = I_D\left(\frac{2}{m}\right), \text{ and}$$

$$\frac{g_m}{I_D} = \frac{1}{V_{REF}}\left(\frac{2}{m}\right).$$

Taking the definition of EKV for $g_M/I_D$ and equating it to the $g_M/I_D$ from our circuit, $$\frac{g_m}{I_D}(ckt.) = \frac{1}{V_{REF}}\left(\frac{2}{m}\right) \Leftrightarrow \frac{g_m}{I_D}(EKV) = \frac{1}{nU_T}\left[\frac{1}{\sqrt{IC+0.25}+0.5}\right].$$

The inversion coefficient can then be found $$\Rightarrow \sqrt{IC+0.25} + 0.5 = \left(\frac{V_{REF}}{nU_T}\right)\left(\frac{m}{2}\right),$$

$$\Rightarrow IC+0.25 = \left[\left(\frac{\alpha \times m}{2}\right) - 0.5\right]^2, \alpha = \left(\frac{V_{REF}}{nU_T}\right),$$

-continued $$\Rightarrow IC + 0.25 = \left[\left(\frac{\alpha \times m}{2}\right) - 0.5\right]^2, \alpha = \left(\frac{V_{REF}}{nU_T}\right), \text{ and}$$

$$\Rightarrow IC = \left(\frac{\alpha \times m}{2}\right)^2 - \left(\frac{\alpha \times m}{2}\right).$$

Now substituting $$\alpha = \left(\frac{V_{REF}}{nU_T}\right) \Rightarrow \frac{nU_T \ln(k)}{nU_T} \Rightarrow \ln(k)$$

$$\Rightarrow IC = \left(\frac{\ln(k) \times m}{2}\right)^2 - \left(\frac{\ln(k) \times m}{2}\right).$$

The inversion coefficient is therefore dependent on only the aspect ratio (k) of the PTAT voltage generator, M32 402 and M33 404, and the $g_M/I_D$ current mirror ratio m set by devices M53 412 and M51 410. This shows that the current reference 100 generates a bias condition such that the MOSFET inversion coefficient is independent of temperature.

Figure 5:
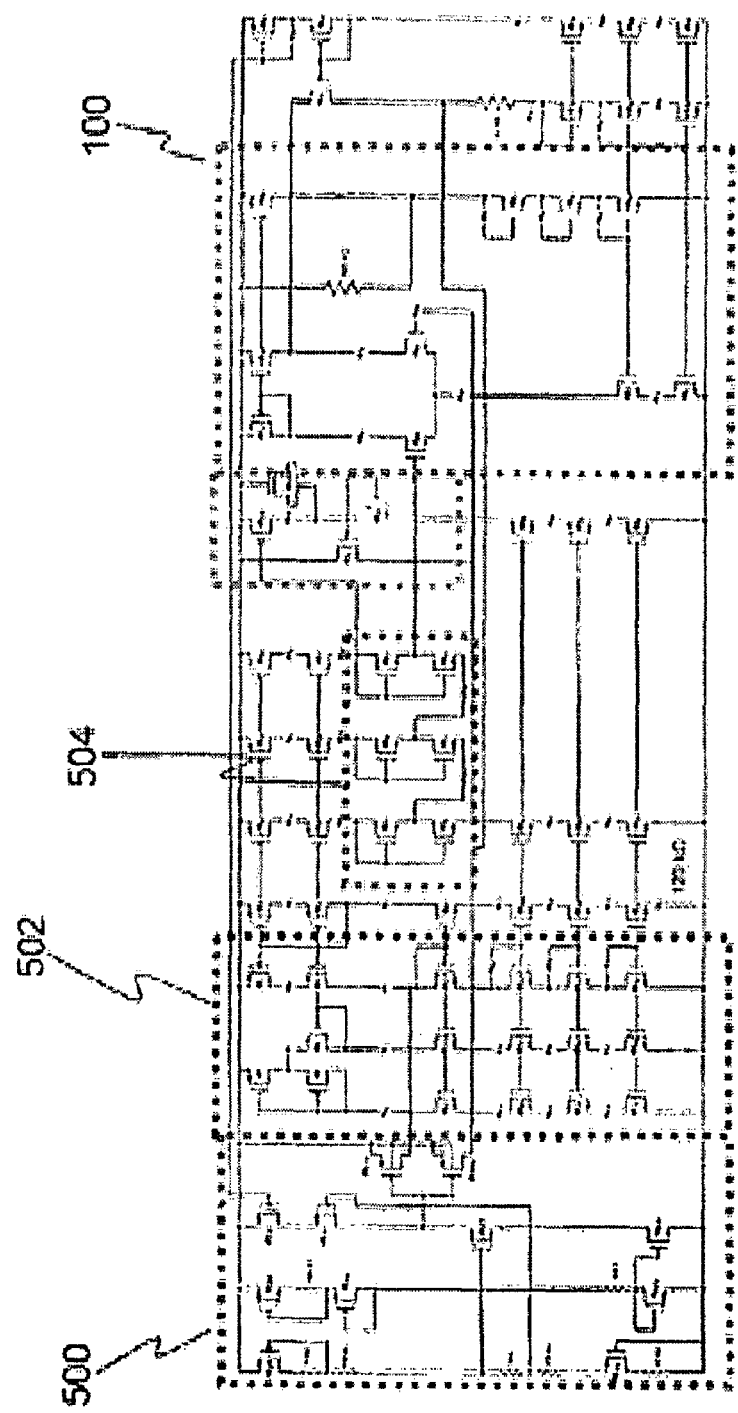
FIG. 5 is a illustration of a complete current reference circuit.

The complete current reference, including startup circuitry and protection devices, is shown in FIG. 5. Numerous cascode devices are added for static voltage protection. Additional VPTAT generating MOSFETs are placed in series to create a larger VREF voltage for better accuracy. M43 and M43B form a feedback loop that prevents the reference voltage, VREF, from floating toward the power rails and causing biasing problems within the $g_M/I_D$ regulator.

Referring to FIG. 5, a complete constant current reference 100, including startup circuitry 500, a low-level current bias 502, a $V_{PTAT}$ generator 504, and a simple Common-Mode Feedback (CMFB) device are shown electrically connected with each other.

Figure 6A:
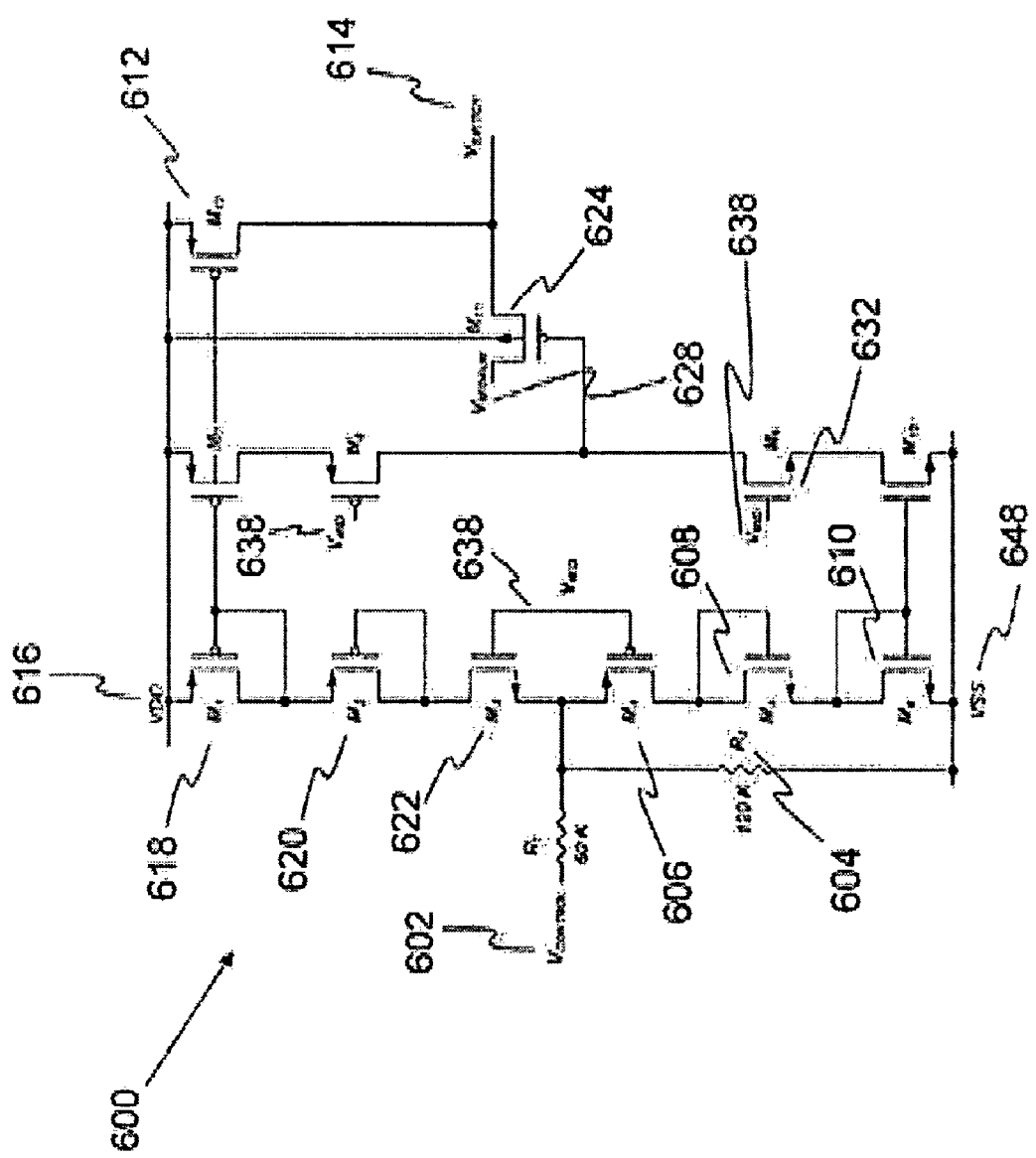
FIG. 6a is a illustration of a power control cell.

Referring to FIG. 6a, example circuitry for a power control cell 104 is provided. Although the power control cell 104 may be configured to allow for a user-defined power control setting, as shown in FIG. 6a, the power control circuit 600 is designed to convert a 0-V/NC or 5-V logic level to a signal used to drive the bias current distribution cell 102. The power control cell 104 may also be configured to enable a user to alternate the operation of a load circuit in either a low-power mode or full-power mode. Switching to half-power mode is accomplished by halving the bias current 122 fed into the amplifier's components 118 and 122 from the bias circuitry 102.

If left floating, the input control signal $V_{CONTROL}$ 602 is pulled low by resistor $R_2$ 604. This causes M4 606, M5 608, and M6 610 to be shut off. In turn, M12 612 is activated, which pulls the output $V_{SWITCH}$ 614 up to a first universal power-pad $V_{DD}$ 616. This high output level is used to signal the half power mode. However, if $V_{CONTROL}$ 602 is pulled high, M1 618, M2 620, and M3 622 are shut off, pulling down M11's 624 gate such that M11 624 shorts the output $V_{SWITCH}$ 614 to $V_{MIDAUX}$ 628. $V_{MIDAUX}$ 628 is a $V_{MID}$ 638 voltage generated by a duplicated $V_{MID}$ 632 cell. This serves to isolate V 628 from the system-wide $V_{MID}$ 638.

Figure 6B:
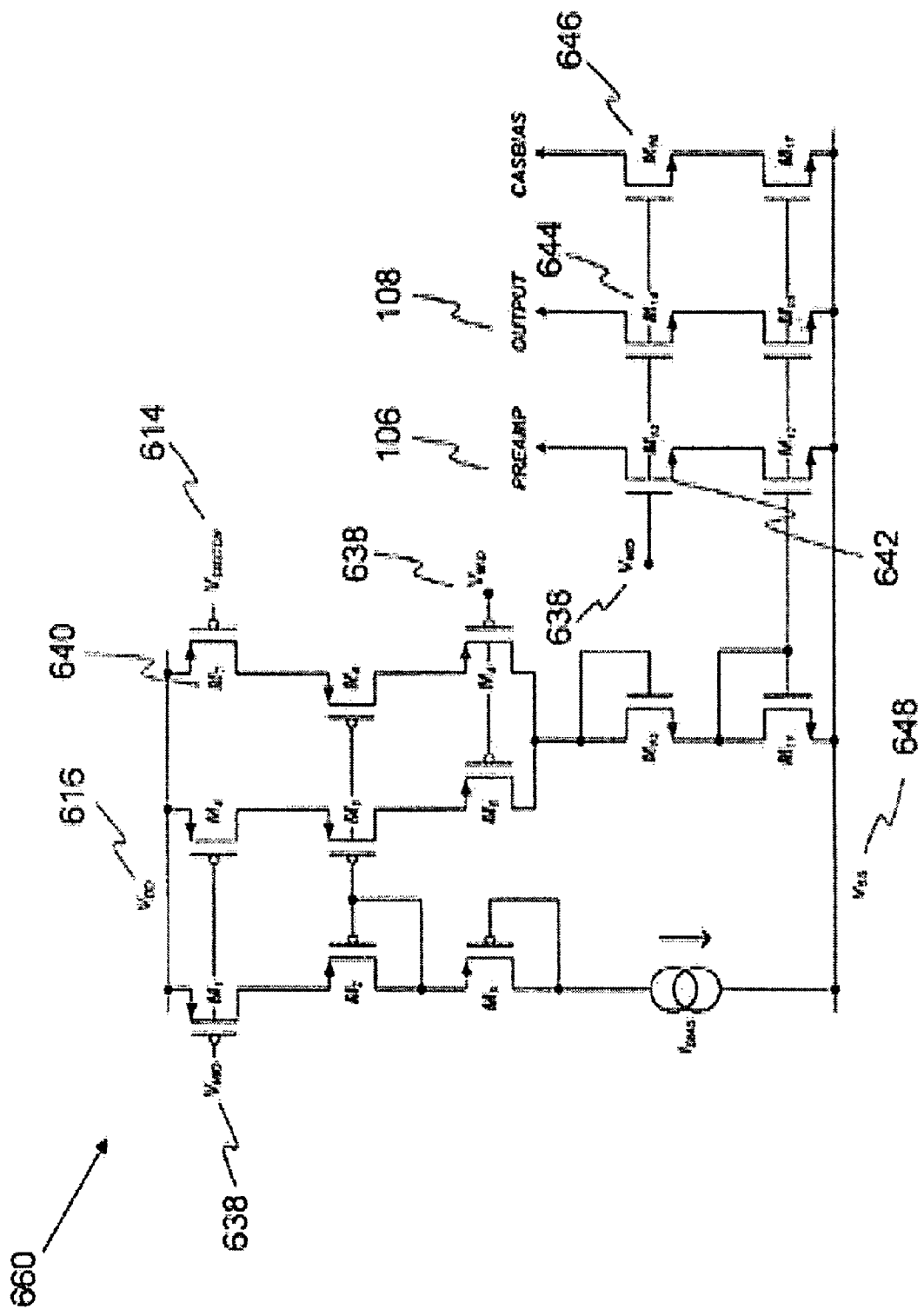
FIG. 6b is a schematic of a current mirror acting as a current distribution cell that distributes the master reference current to the pre-amp and output stages of a operational amplifier.

This output signal $V_{SWITCH}$ 614 is connected to a current bias circuit 660 that splits the output of the current reference and feeds it into the necessary branches of the operational amplifier. This circuitry is shown in FIG. 6b. $V_{SWITCH}$ 614, coming from a power control 104, is either at a high voltage level, universal power-pad $V_{DD}$ 616, or at $V_{MID}$ 638. If it is high, M7 640 is turned off, in turn shutting off M8 642 and M9 644. This is considered 'half power' mode as only half of the 'full power' current is being fed into the amplifier. If $V_{SWITCH}$ 614 is at the $V_{MID}$ 638 voltage level, M7 640 is on, mirroring the current from the M1 6, M2, and M3 branch, placing the amplifier (not shown) in 'full power' mode. The gates of the cascode current mirror devices M12 642, M14 644, and M16 646 are tied to $V_{MID}$ 638 to prevent SOA violations over PVT.

Figure 7:
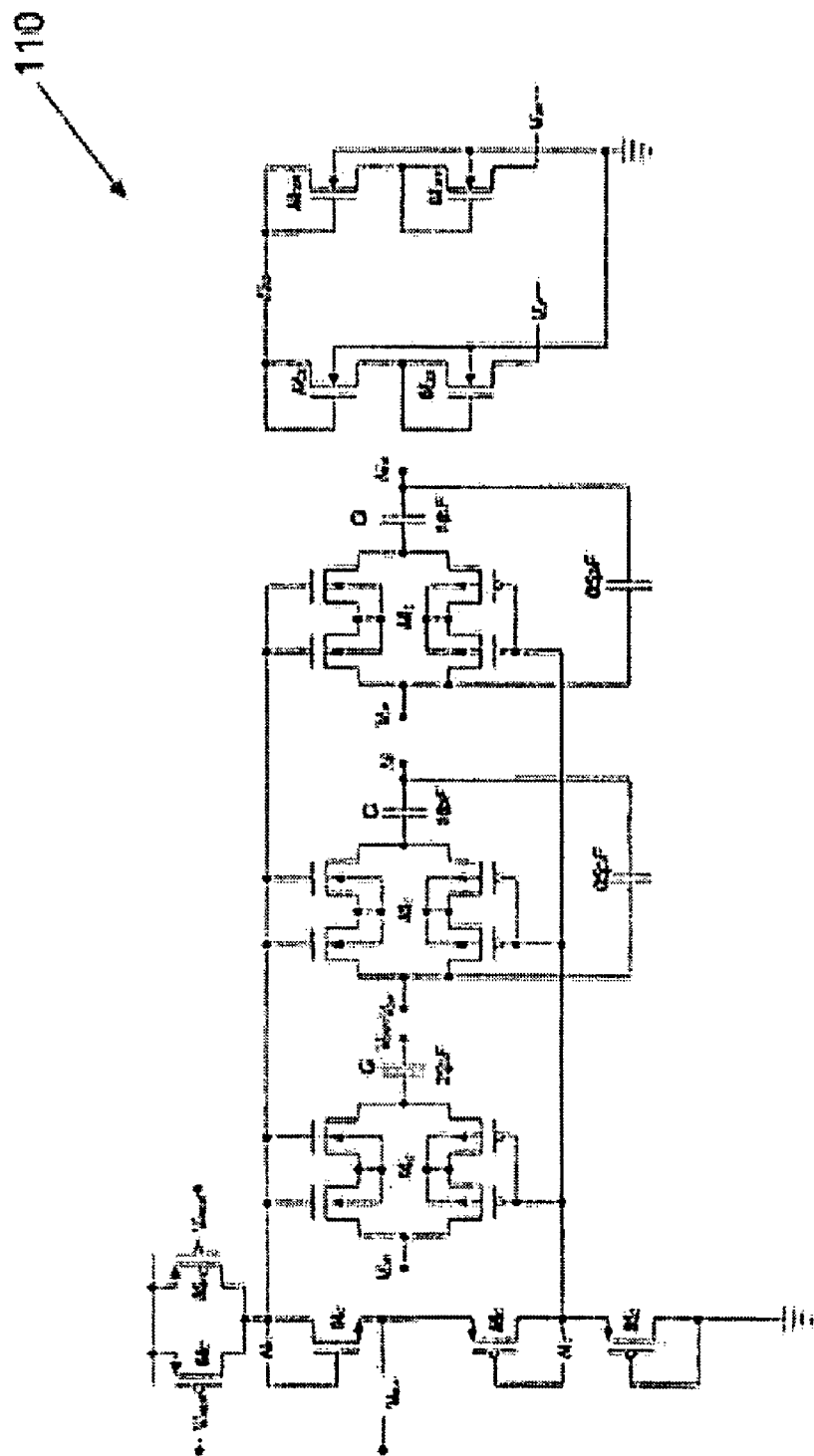
FIG. 7 is a schematic of a frequency compensation network.

An input stage differential paired with an example of a dynamic protection device is shown in FIG. 7. This protection is required to shield the input pairs, as well as the current steering devices. As the common-mode input voltage approaches the universal-power-pad $V_{SS}$ 648, the VDG on the NMOS input pair will approach roughly $V_{DD}$-$V_{SG,P}$. In the same way, if the common-mode level goes high, the PMOS input pair will experience excessive VGD. Actively biased cascode devices are added to prevent this. However, they must be biased in such a way as not to clamp the amplifiers ICMR at high common-mode voltages, and must prevent low common-mode voltages from creating an SOA violation.

Attached herewith, and incorporated herein in its entirety, is Appendix A, "DESIGN OF A 5-V COMPATIBLE RAIL-TO-RAIL INPUT/OUTPUT OPERATIONAL AMPLIFIER IN 3.3-V SOI CMOS FOR WIDE TEMPERATURE RANGE OPERATION."

What is claimed is:

1. A reference current circuit comprising:
   a low-level current bias circuit;
   a voltage proportional-to-absolute temperature generator for creating a proportional-to-absolute temperature voltage ($V_{PTAT}$) electrically connected to the low-level current bias circuit; and
   a MOSFET-based constant inversion coefficient (IC) regulator circuit including a constant-IC input and constant-IC output, the constant-IC input electrically connected with the $V_{PTAT}$ generator such that the voltage proportional-to-absolute temperature is the input into the constant-IC regulator circuit;
   whereby the constant-IC output maintains a constant IC current.

2. A reference current circuit as set forth in claim 1, wherein the reference circuit further comprising a bias current distribution circuit, the bias current distribution circuit comprising:
   a bias current circuit;
   a bias current output electrically connected to the bias current circuit;
   a current reference input electrically connected to the bias current circuit; and
   a power input electrically connected to the bias current circuit, where the current reference input is electrically connected with the current reference circuit via the constant-IC output, with the bias current distribution circuit generating an output bias current in response to the constant-IC output;
   whereby the output bias current is used to bias a load circuit such that the performance characteristics over a wide temperature range are minimized.

3. A reference current circuit as set forth in claim 2, further comprising a startup circuit electrically connected to the reference circuit such that if the startup reference current is larger than the output current of the constant-IC regulator, current is injected into the bias circuitry of the $V_{PTAT}$ generator and the constant-IC regulator to facilitate startup of the current reference.

4. A reference current circuit as set forth in claim 2, further comprising a common-mode feedback (CMFB) circuit electrically connected with the input of the reference circuit whereby the CMFB circuit prevents $V_{PTAT}$ from floating.

5. A self-biased operational amplifier comprising:
a current reference circuit including:
   a low-level current bias circuit;
   a voltage proportional-to-absolute temperature generator for creating a proportional-to-absolute temperature voltage ($V_{PTAT}$) electrically connected to the low-level current bias circuit;
   a MOSFET-based constant-IC regulator circuit including a constant-IC input and constant-IC output, the constant-IC input electrically connected with the $V_{PTAT}$ generator such that the voltage proportional to absolute temperature is the input into the constant-IC regulator circuit;
a bias current distribution circuit comprising:
   a bias current circuit;
   a bias current output electrically connected to the bias current circuit;
   a current reference input electrically connected to the bias current circuit; and
   a power input electrically connected to the bias current circuit, where the current reference input is electrically connected with the current reference circuit via the constant-IC output, with the bias current distribution circuit generating an output bias current in response to the constant-IC output;
an input stage electrically connected with a reference voltage $V_{REF}$ to set the common-mode level, the input stage further including:
   an input circuit, a non-inverting input, a inverting input, a output, and a current bias input, the current bias input electrically connected with the bias current output; and
   an output stage including an output circuit, a non-inverting input electrically connected with the output circuit, an inverting input electrically connected with the output circuit, an output electrically connected with the output circuit, and a current bias input electrically connected with the output circuit, the current bias input further electrically connected with the bias current output;
   whereby the output bias current biases the pre-amp and output driver of the load circuit to stabilize the small signal and large signal characteristics.

6. A self-biased operational amplifier as set forth in claim 5, wherein the input stage further comprises:
   a first universal power pad $V_{DD}$ and a second universal power pad $V_{ss}$;
   a tail current steering device electrically connected with $V_{DD}$ and $V_{ss}$;
   a complementary input pair electrically connected in parallel with the tail current steering device via $V_{DD}$ and $V_{ss}$;
   a regulated folded cascode electrically connected in parallel with the tail current steering device via $V_{DD}$ and $V_{ss}$; and
   a common-mode feedback circuit electrically connected in parallel with the tail current steering device via $V_{DD}$ and $V_{ss}$;
   whereby the fully differential input stage allows for a controlled output level for small-signal inputs, and a clampable output signal when slewing.

7. A self-biased operational amplifier as set forth in claim 6, wherein the reference circuit further includes a power control electrically connected with the current distribution circuit for operating the load circuit in either a full power mode or half power mode whereby switching to half power mode is accomplished by halving the bias current fed into a load circuit component from the current reference.

8. A self-biased operational amplifier as set forth in claim 5, wherein the operational amplifier further comprises a power control electrically connected with the bias distribution cell, the power control to convert a 0-V or NC (no connection) state or 5-V logic level to a signal to drive the bias current distribution cell.

9. A self-biased operational amplifier as set forth in claim 8, wherein the power control operates the load circuit in either a full-power mode or half-power mode whereby switching to half-power mode is accomplished by halving the bias current fed into a load circuit component from the current reference.

10. A self-biased operational amplifier as set forth in claim 5, wherein the output of the input stage further comprises a regulated folded cascode circuit, the regulated folded-cascode structure provides high output resistance and therefore high gain for the first stage.

11. A self-biased operational amplifier as set forth in claim 5, wherein the self-biased operational amplifier further comprises a frequency compensation network electrically connected between the output of the output stage and the input of the output stage, the frequency compensation network comprising:
   a Miller capacitor electrically connected with the frequency compensation network;
   a matching capacitor; and
   an array of MOSFETs electrically connected to each other;
   whereby the compensation network utilizes Miller compensation with right-half plane zero compensation.

12. A self-biased operational amplifier comprising:
a current reference circuit including:
   a low level current bias circuit;
   a voltage proportional-to-absolute temperature generator for creating a proportional-to-absolute temperature voltage ($V_{PTAT}$) electrically connected to the low level current bias circuit; and
   a MOSFET-based constant-IC regulator circuit including a constant IC input and constant-IC output, the constant-IC input electrically connected with the $V_{PTAT}$ generator such that the voltage proportional to absolute temperature is the input into the constant-IC regulator circuit;
a bias current distribution circuit including:
   a bias current output;
   a current reference input; and
   a power input, the current reference input is electrically connected with the current reference circuit via the constant-IC output, the bias current distribution circuit acting to generate an output bias current in response to the constant-IC output; and
an input stage electrically connected with a reference voltage $V_{REF}$ to set the common-mode output level, the input stage further including:
   a non-inverting input, an inverting input, an output, and an current bias input, the current bias input electrically connected with the bias current output;
   an output stage including a non-inverting input, an inverting input, an output, an output branch comprising a cascode structure, and a current bias input, the current bias input electrically connected with the bias current output; and
   a regulated-ohmic cascode structure to bias the cascode structure in the output branch;
   whereby the output bias current is used to bias the input stage and output driver of the load circuit.

13. A self-biased operational amplifier as set forth in claim 12, wherein a frequency compensation network is electrically connected between the output of the output stage and the inputs of the output stage, the frequency compensation network comprising:
- a Miller capacitor electrically connected with the frequency compensation network;
- a matching capacitor; and
- an array of MOSFETs electrically connected to each other;
- whereby the compensation network utilizes Miller compensation with right-half-plane zero-compensation.

14. A self-biased operational amplifier as set forth in claim 13, wherein the input stage further comprises:
- a first universal power pad $V_{DD}$ and a second universal power pad $V_{ss}$;
- a tail current steering device electrically connected with $V_{DD}$ and $V_{ss}$;
- a complementary input pair electrically connected in parallel with the tail current steering device via $V_{DD}$ and $V_{ss}$;
- a regulated folded cascode electrically connected in parallel with the tail current steering device via $V_{DD}$ and $V_{ss}$; and
- a common-mode feedback circuitry electrically connected in parallel with the tail current steering device via $V_{DD}$ and $V_{ss}$;
- whereby the fully differential input stage allows for a relatively controlled output level for small-signal inputs, and a clamp-able output signal when slewing (large-signal).

15. A self-biased operational amplifier as set forth in claim 12, wherein the reference circuit further includes a power control for operating the load circuit in either a full power mode or half power mode whereby switching to half power mode is accomplished by halving the bias current fed into a load circuit component from the current reference.

16. A reference current circuit comprising:
- a master current reference circuit including:
  - a bias current output;
  - a current reference input;
  - a constant-IC output;
  - a bias current distribution circuit;
  - a power input, the current reference input is electrically connected with the current reference circuit via the constant-IC output, the bias current distribution circuit acting to generate an output bias current in response to the constant-IC output;
- a bias current distribution cell including:
  - a low level current bias circuit;
  - a voltage proportional-to-absolute temperature generator for creating a proportional-to-absolute temperature voltage ($V_{PTAT}$) electrically connected to the low level current bias circuit; and
  - a MOSFET-based constant-IC regulator circuit including a constant IC input and constant-IC output, the constant-IC input electrically connected with the $V_{PTAT}$ generator such that the voltage proportional-to-absolute temperature is the input into the constant-IC regulator circuit; and
- a power control electrically connected with the bias distribution cell, the power control able to convert a 0-V/NC or 5-V logic level to a signal used to drive the bias current distribution cell;
- whereby the output bias current may be used to bias a load circuit such that the performance characteristics over a wide temperature range are stabilized in response to the power control signal.

17. A reference current circuit as set forth in claim 16, further comprising a startup circuit electrically connected to the reference circuit such that if the startup reference current is larger than the output current of the constant-IC regulator, current is injected into the bias circuitry of the $V_{PTAT}$ generator and the constant-IC regulator to facilitate startup of the current reference.

18. A reference current circuit as set forth in claim 16, further comprising a common-mode feedback (CMFB) circuit electrically connected with the input of the reference circuit whereby the CMFB circuit prevents $V_{PTAT}$ from floating.

* * * * *